(12) United States Patent
Chen et al.

(10) Patent No.: US 10,134,698 B2
(45) Date of Patent: Nov. 20, 2018

(54) BONDING PAD STRUCTURE, BONDING RING STRUCTURE, AND MEMS DEVICE PACKAGING METHOD

(71) Applicants: Semiconductor Manufacturing International (Beijing) Corporation, Beijing (CN); Semiconductor Manufacturing International (Shanghai) Corporation, Shanghai (CN)

(72) Inventors: Fucheng Chen, Shanghai (CN); Linbo Shi, Shanghai (CN); Yao Liu, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/223,525

(22) Filed: Jul. 29, 2016

(65) Prior Publication Data
US 2017/0084557 A1   Mar. 23, 2017

(30) Foreign Application Priority Data
Sep. 23, 2015  (CN) .......................... 2015 1 0614165

(51) Int. Cl.
*H01L 23/48* (2006.01)
*H01L 23/00* (2006.01)
*B81C 1/00* (2006.01)

(52) U.S. Cl.
CPC .......... *H01L 24/05* (2013.01); *B81C 1/00269* (2013.01); *H01L 24/02* (2013.01);
(Continued)

(58) Field of Classification Search
CPC .......... B81C 1/00269; B81C 2203/019; B81C 2203/0118; B81C 2203/0109;
(Continued)

(56) References Cited

U.S. PATENT DOCUMENTS 6,864,578 B2 *  3/2005  Angell .................. H01L 24/03
                                                     257/734
2003/0104651 A1  6/2003  Kim et al.
(Continued)

FOREIGN PATENT DOCUMENTS

CN         104066270 A     9/2014

*Primary Examiner* — Shouxiang Hu
(74) *Attorney, Agent, or Firm* — Anova Law Group, PLLC

(57) ABSTRACT

The present disclosure provides bond pad structures, boning ring structure; and MEMS device packaging methods. An exemplary bonding pad structure includes a plurality of first metal blocks made of a first metal material; and a plurality of second metal blocks made of a second metal material. The plurality of first metal blocks are used to prevent the squeezing out and extending of the plurality of second metal blocks. On at least one equal dividing plane of the bonding pad structure, the first metal material is shown at least one time; and the second metal material is shown at least one time.

11 Claims, 7 Drawing Sheets

(52) U.S. Cl.
CPC ........ *H01L 24/29* (2013.01); *B81B 2207/093* (2013.01); *B81C 2203/019* (2013.01); *B81C 2203/0109* (2013.01); *B81C 2203/0118* (2013.01); *B81C 2203/035* (2013.01); *H01L 2224/0401* (2013.01); *H01L 2224/052* (2013.01); *H01L 2224/05013* (2013.01); *H01L 2224/05078* (2013.01); *H01L 2924/01013* (2013.01); *H01L 2924/01032* (2013.01); *H01L 2924/1461* (2013.01); *H01L 2924/3841* (2013.01)

(58) Field of Classification Search
CPC ............... B81C 2203/035; H01L 24/05; H01L 2224/052; H01L 2224/05078; H01L 2224/0401; H01L 2924/3841; H01L 2924/1461; H01L 2924/01013; H01L 2924/01032; H01L 2224/05013; H01L 24/02; H01L 2224/05552; H01L 24/29
See application file for complete search history.

(56) References Cited

U.S. PATENT DOCUMENTS

| | | | |
|---|---|---|---|
| 2012/0280409 A1* | 11/2012 | Trautmann | B81C 1/00269 257/782 |
| 2012/0299128 A1 | 11/2012 | Noda | |
| 2015/0311178 A1* | 10/2015 | Shin | B81C 1/00238 438/109 |
| 2017/0178929 A1* | 6/2017 | Chidambaram | H01L 21/50 |

\* cited by examiner

BONDING PAD STRUCTURE, BONDING RING STRUCTURE, AND MEMS DEVICE PACKAGING METHOD

CROSS-REFERENCES TO RELATED APPLICATIONS

This application claims the priority of Chinese patent application No. 201510614165.2, filed on Sep. 23, 2015, the entirety of which is incorporated herein by reference.

FIELD OF THE INVENTION

The present invention generally relates to the field of semiconductor manufacturing and, more particularly, relates to bonding pad structures, bonding ring structures and MEMS device packaging processes.

BACKGROUND

Micro-Electro-Mechanical-System (MEMS), also referred as micro-system or micro-machine, is a high-tech type of electro-mechanical system. MEMS devices are developed based upon microelectronic technologies and semiconductor manufacturing technologies. MEMS devices are formed by the combination of the thin film technology, the photolithography technology, the bonding technology, the silicon micromachining technology, the non-silicon micromachining technology, and the precise micromachining technology, etc. MEMS devices include a plurality of types of devices, such as MEMS sensors and MEMS actuators, etc. Among MEMS devices, the MEMS sensors have been widely used in the protection systems of automobile, inertia control system, home appliance, and various kinds of apparatus, and the systems of many other industries, scientific and engineering systems, etc. Specifically, the MEMS sensors include accelerating sensors, pressure sensors, vibrational gyroscopes, and micro-relays, etc.

A MEMS device needs a cavity to isolate the effects from external environments. To form such a cavity, it needs to bond the substrate of the MEMS device with a cover plate. The bonding process includes the silicon-silicon direct bonding process, the eutectic bonding process, the silicon alloy bonding process, or the glass frit bonding process, etc. Among such bonding processes, the eutectic bonding process has certain advantages, such as high efficiency and high packaging performance, etc.

During the eutectic bonding process, it often needs a bonding pad structure or a bonding ring structure. FIG. 1 illustrates an exemplary MEMS packaging structure.

As shown in FIG. 1, the MEMS packaging structure includes a MEMS device substrate 110, and a cover plate substrate 120. The MEMS device substrate 110 includes a passivation layer. Some parts of the MEMS device substrate are omitted in FIG. 1, and the passivation layer is not labeled. The passivation layer is partially etched to form trenches 112. The bottoms of the trenches 112 expose bonding pads 111. Protruding structures 121 are formed on the cover plate substrate 120. Further, a metal layer 122 is formed on the top surfaces of the protruding structures 121. During the packaging process, the metal layer 122 and the bonding pads 111 are fused together to form a metal alloy; and the metal layer 122 and the bonding pads 111 are bonded together. One of the purposes for forming the protruding structures 121 is to enable the metal layer 122 to reach the bottoms of the trenches 112 to contact with the bonding pads 111. One of the purposes to form the trenches 112 is to prevent the squeezing out and extending of the material of the bonding pads 111.

However, forming the protruding structures 121 and the trenches 112 increases process steps, process time and production cost, etc. Further, the protruding structures 121 are easily damaged; and the reliability of the packaging structure is reduced.

FIG. 2 illustrates an existing MEMS packaging method. As shown in FIG. 2, bonding pads 221 are formed on the bonding surface of the MEMS device wafer 210 directly without forming trenches. Then, bonding pads 221 are formed on the bonding surface of the cover plate wafer 220. Then, the bonding pads 211 and the bonding pads 221 are bonded together (not shown) to package the MEMS device wafer 210 and the cover plate wafer 220 together (not shown).

As shown in FIG. 3, the bonding pads 211 are made of one metal material. That is, the top view of the bonding pad 211 is a complete coverage structure. The structures of the bonding pads 221 are usually identical to the structures of the bonding pads 211. At least one of the metal material of the bonding pads 221 and the metal material of the bonding pads 211 has a relatively good ductility to facilitate the eutectic bonding process. When the bonding pads 211 having the complete coverage structure illustrated in FIG. 3 are used, it may be easy for the material having the relatively good ductility to be squeezed out and stretched during the bonding process. That is, during the bonding process, the material having the relatively good ductility overflows to the surrounding regions of the bonding pads 211. When the metal material overflows in the surrounding regions of the bonding pads with a relatively large amount, it may be easy to cause the adjacent conductive structures and the bonding pads to have a short-circuit issue. Accordingly, the reliability of the packaging structure may be reduced.

The disclosed device structures and methods are directed to solve one or more problems set forth above and other problems in the art.

BRIEF SUMMARY OF THE DISCLOSURE

One aspect of the present disclosure includes a bonding pad structure. An exemplary bonding pad structure includes a plurality of first metal blocks made of a first metal material; and a plurality of second metal block made of a second metal material. On at least one equal dividing plane of the bonding pad structure, the first metal material is shown at least one time; and the second metal material is shown at least one time. The first metal blocks are used to prevent the squeezing out of the second metal blocks.

Another aspect of the present disclosure includes a method for packaging MEMS devices. The method includes providing a MEMS device wafer having a first bonding surface; providing a cover plate wafer having a second bonding surface; forming at least one bonding pad structure having a plurality of first metal blocks made of a first metal material and a plurality of second metal blocks made of a second metal material on at least one of the first bonding surface and the second bonding surface; and bonding the MEMS device wafer and the cover plate wafer using the at least one bonding pad structure. The first metal blocks are used to prevent the squeezing out of the second metal blocks.

Another aspect of the present disclosure includes a method for packaging MEMS devices. The method includes providing an MEMS device wafer having a first bonding surface; providing a cover plate wafer having a second bonding surface; forming at least one bonding ring structure made of a first metal material and a second metal material on at least one of the first bonding surface and the second bonding surface; and bonding the MEMS device wafer and the cover plate wafer using the at least one bonding ring structure.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
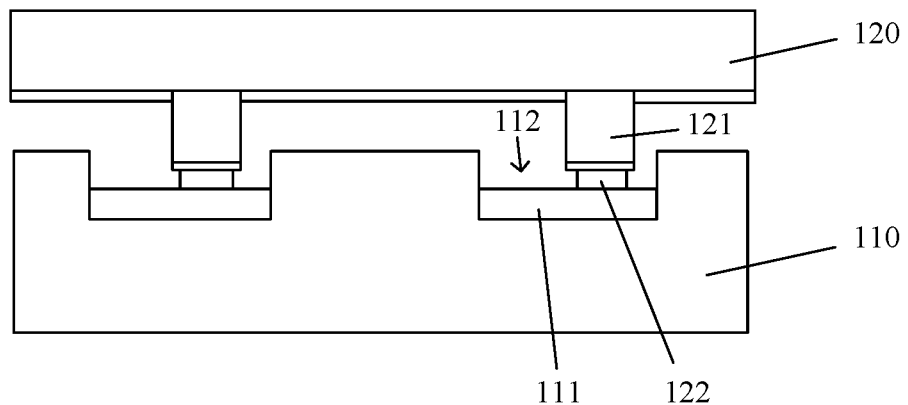
FIG. 1 illustrates an existing MEMS packaging structure.
Figure 2:
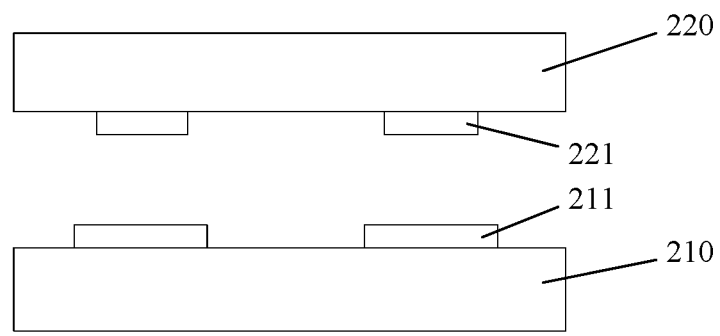
FIG. 2 illustrates a structure corresponding to certain stages of an existing MEMS packaging method.
Figure 3:
FIG. 3 illustrates a top view of one bonding pad of the structure illustrated in FIG. 2.
Figure 4:
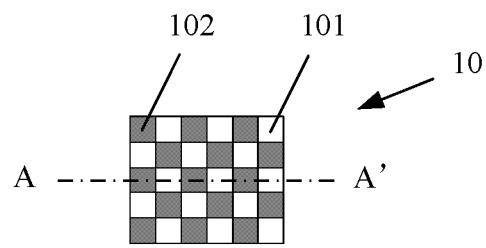
FIG. 4 illustrates a top view of an exemplary bonding pad structure consistent with the disclosed embodiments.
Figure 5:
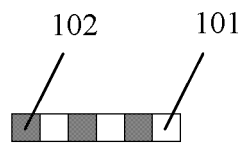
FIG. 5 illustrates a cross-sectional view of the structure illustrated in FIG. 4 along the AA' direction.

FIGS. 4-5 illustrate an exemplary bonding pad structure consistent with the disclosed embodiments. FIG. 5 is a cross-sectional view of the structure illustrated in FIG. 4 along the AA' direction.

The bonding pad structure may be made of a first metal material and a second metal material. Specifically, as shown in FIGS. 4-5, the bonding pad structure 10 may include a plurality of first metal blocks 101 and a plurality of second metal blocks 102. On a top viewing plane, the plurality of first metal blocks 101 and the plurality of second metal blocks 102 may be distributed into rows and columns. The plurality of first metal blocks 101 may be made of the first metal material; and the plurality of second metal blocks 102 may be made of the second metal material.

In the top viewing plane illustrated in FIG. 4, in one row, one second metal block 102 may be disposed between two adjacent first metal blocks 101; and one first metal block 101 may be disposed between two adjacent second metal blocks 102. In one column, one second metal block 102 may be disposed between two adjacent first metal blocks 101; and one first metal block 101 may be disposed between two adjacent second metal blocks 102. Such a uniform row and column distribution (e.g., a checker formation) may facilitate the subsequent bonding of the bonding pad structure 10 to another bonding pad structure. The number of the first metal blocks 101 and the number of the second metal blocks 102 may be any appropriate value.

In one embodiment, the cross-sectional plane along the AA' direction may be perpendicular to the top viewing plane of the bonding pad structure 10. Further, the cross-sectional plane may divide the bonding pad structure 10 into to two equal parts. Thus, the cross-sectional plane may be a perpendicular and equal dividing plane. The cross-sectional plane illustrated in FIG. 5 may be an equal dividing cross-sectional plane. The equal dividing cross-sectional plane may be obtained by crossing the bonding pad structure 10 along a perpendicular equal dividing plane. The perpendicular equal dividing plane may be perpendicular to the top viewing plane of the bonding pad structure 10. Further, the perpendicular equal dividing plane may be able to divide the bonding pad structure 10 into two equal parts.

In one embodiment, the bonding pad structure 10 at the cross-sectional plane illustrated in FIG. 5 may show three first metal blocks 101 and three second metal blocks 102. That is, the first metal material may be shown three times and the second metal material may be shown three times in the cross-sectional viewing plane illustrated in FIG. 5.

In certain other embodiments, in the at least one equal dividing plane, one first metal block 101 and at least one second metal block 102 may be shown, or a plurality of first metal blocks 101 and a plurality of second metal blocks 102 may be shown.

In certain other embodiments, when the first metal material and the second metal material are shown alternatively, the outer metal material may all be the first metal material. Under such a configuration, the second metal material may be selected from the metal material having a relatively good ductility; and the first metal material may be selected from the metal material having a moderate ductility. Such selections of the metal materials may be able to use the first metal material to protect the second metal material.

The first metal material and the second metal material may be any appropriate material. In one embodiment, the first metal material is Ge; and the second metal material is Al. Ge may have a moderate ductility, and thus Ge itself may not be squeezed out and extended. Further, Ge may be able to form a GeAl alloy with Al that has a relatively good performance. The conductivity of Al may be relatively good; and the ductility of the Al may be relatively good. Such properties may facilitate Al and Ge to have an enough contact during the bonding process. Accordingly, it may ensure to thoroughly form AlGe alloy during the bonding process; and to form a sturdy bonding structure.

Thus, the bonding pad structure 10 may have a plurality of first metal blocks 101 and a plurality of second metal blocks 102, during the subsequent process for bonding the bonding pad structure 10 with another bonding pad structure 10, or other bonding pad structures, the plurality of first meal blocks 101 and the plurality of second metal blocks 102 may directly form metal alloy. That is, the first metal material and the second metal material may directly form the metal alloy. Further, the first metal blocks 101 and the second metal blocks 102 may be alternatively distributed. Thus, it may be able to prevent the first metal blocks 101 and the second metal blocks from excessively overflowing around the bonding pad structure 10. Even the first metal blocks 101 and the second metal block 102 may overflow, the overflow amount may be acceptable.

Thus, when the bonding surfaces of two semiconductor structures, for example, two wafers, have the at least one bonding pad structure 10, during the process for bonding the two semiconductor structures together, the first metal material of the bonding pad structure 10 on the first semiconductor structure and the second metal material of the bonding pad structure 10 on the second semiconductor structure may form a metal alloy. The first metal material of the bonding pad structure 10 on the second semiconductor structure and the second metal material of the bonding pad structure 10 on the first semiconductor structure may form a metal alloy. Thus, the metal alloys may bond the two semiconductor structures together. That is, one of the major functions of the metal alloys may be to bond the two semiconductor structures together.

The first metal blocks 101 and the second metal blocks 102 in each semiconductor structure may also form meal alloy. Thus, the overflow of the first metal material having a relatively good ductility or the second metal having a relatively good ductility may be prevented. That is, using the bonding pad structure 10 to perform a bonding process, the bonding pad structure 10 may prevent the squeezing out and extending issue. Accordingly, the short-circuit between the bonding pad structure 10 and the surrounding conductive structures may be prevented. Thus, the reliability of the packaging structure having the disclosed bonding pad structure 10 may be improved.

Figure 6:
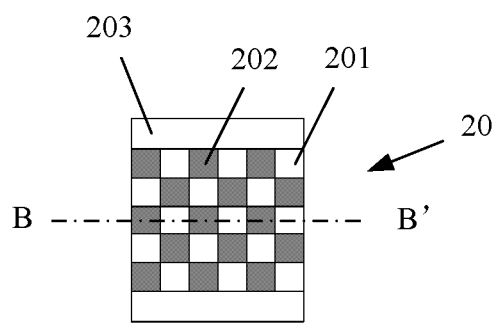
FIG. 6 illustrates a top view of another exemplary bonding pad structure consistent with the disclosed embodiments.
Figure 7:
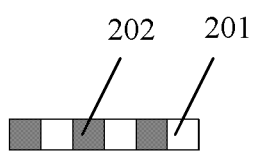
FIG. 7 illustrates a cross-sectional view of the structure illustrated in FIG. 6 along the BB' direction.

FIGS. 6-7 illustrate another exemplary bonding pad structure consistent with the disclosed embodiments. FIG. 7 is a cross-sectional view of the structure illustrated in FIG. 6 along the BB' direction.

The bonding pad structure may be made of a first metal material and a second metal material. Specifically, as shown in FIGS. 6-7, the bonding pad structure 20 may include a plurality of first metal blocks 201 and a plurality of second metal blocks 202. On a top viewing plane, the plurality of first metal blocks 201 and the plurality of second metal blocks 202 may be distributed into rows and columns. The plurality of first metal blocks 201 may be made of the first metal material; and the plurality of second metal blocks 202 may be made of the second metal material.

In the top view plane illustrated in FIG. 6, in one row, one second metal block 202 may be disposed between two adjacent first metal blocks 201; and one first metal block 201 may be disposed between two adjacent second metal blocks 202. In one column, one second metal block 202 may be disposed between two adjacent first metal blocks 201; and one first metal block 201 may be disposed between two adjacent second metal blocks 202. Such a uniform row and column distribution may facilitate the subsequent bonding of the bonding pad structure 20. The number of the first metal blocks 101 and the number of the second metal block 102 may be any appropriate value.

Further, as shown in FIG. 6, the bonding pad structure 20 may also include two first metal stripes 203. The plurality of first metal blocks 201 and the plurality of second metal blocks 202 may present as a rectangle as a whole. The two first metal stripes 203 may be disposed at two parallel sides of the rectangle. That is, the rectangle may be in between the two first metal stripes 203; and the two first metal stripes 203 may be able to protect the rectangle.

In certain other embodiments, when the plurality of first metal blocks 201 and the plurality of second metal blocks 202 present as a rectangle as a whole, one first metal stripe may be disposed outside any side of the rectangle; or three first metal stripes may be disposed outside of any three sides of the rectangle, respectively; or four first meal stripes may be disposed outside of all sides of the rectangle, respectively. In still certain other embodiments, when the plurality of first metal blocks 201 and the plurality of second metal blocks 202 present as other shapes as a whole, first metal stripes may be disposed outside of one or more sides of the shape. For example, when the plurality of first metal blocks 201 and the plurality of second metal blocks 202 present as a hexagon as a whole, one or more metal stripes may be disposed outside of one or more of the six sides of the hexagon, respectively.

In one embodiment, in the cross-sectional plane shown in FIG. 7, two first metal blocks 201 and two second block 202 may be shown. That is, the first metal material and the second metal material may be shown twice, respectively; and the first metal material and the second metal material may be alternatively shown.

In certain other embodiments, in an equal dividing plane of the bonding pad structure 20, the first metal material and the second metal material may be shown one time, respectively, or a plurality of times, respectively. The equal dividing plane may be obtained by crossing the bonding pad structure 20 along a perpendicular equal dividing plane. The perpendicular equal dividing plane may be perpendicular to the top viewing plane of the bonding pad structure 20. Further, the perpendicular equal dividing plane may be able to divide the bonding pad 10 into two equal parts. In one embodiment, the cross-sectional plane along the BB' is perpendicular to the top viewing plane of the bonding pad structure 20; and the cross-sectional plane may divide the bonding pad structure 20 into two equal parts. Thus, the cross-sectional plane may belong to the perpendicular equal dividing plane. That is, the cross-sectional plane illustrated in FIG. 7 may be an equal dividing plane.

The first metal material and the second metal material may be any appropriate material. In one embodiment, the first metal material is Ge; and the second metal material is Al.

Besides the advantages of the bonding pad structure 10 illustrated in FIG. 4, the bonding pad structure 20 may providing extra benefits. Because the bonding pad structure 20 may have two first metal stripes 203; and the two first metal stripes 203 may hold the parallel first metal blocks 201 and the second metal blocks 201 in between, during the subsequent bonding process, the second metal blocks 202 may not only be able to form metal alloy with first metal blocks 201, but also form metal alloy with first metal stripes 203. Therefore, except the most outer edges of the bonding pad structure 20 may have a less amount of second metal material, all other second metal blocks 202 may not be squeezed out to the surrounding area of the bonding pad structure 20. Thus, the squeezing out and extending issue may be further prevented. Accordingly, the short-circuit issue between the bonding pad structure 20 and the surrounding conductive structures may be further prevented; and the reliability of the packaging structure formed by using the bonding pad structure 20 may be further improved.

Figure 8:
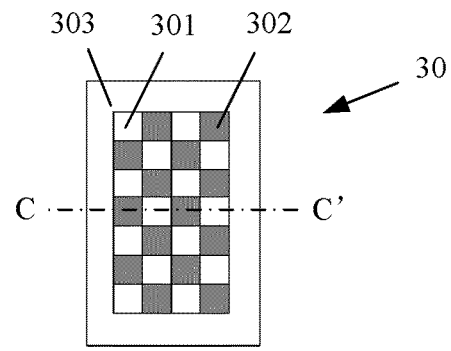
FIG. 8 illustrates a top view of another exemplary bonding pad structure consistent with the disclosed embodiments.
Figure 9:
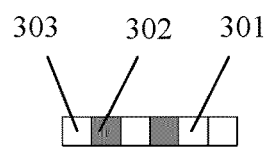
FIG. 9 illustrates a cross-sectional view of the structure illustrated in FIG. 8 along the CC' direction.

FIGS. 8-9 illustrate another exemplary bonding pad structure consistent with the disclosed embodiments. FIG. 9 is a cross-sectional view of the structure illustrated in FIG. 8 along the CC' direction.

The bonding pad structure may be made of a first metal material and a second metal material. Specifically, as shown in FIGS. 8-9, the bonding pad structure 30 may include a plurality of first metal blocks 301 and a plurality of second metal blocks 302. On a top viewing plane, the plurality of first metal blocks 301 and the plurality of second metal blocks 302 may be distributed into rows and columns. The plurality of first metal blocks 301 may be made of the first metal material; and the plurality of second metal blocks 302 may be made of the second metal material.

In the top view plane illustrated in FIG. 8, in one row, one second metal block 302 may be disposed between two adjacent first metal blocks 301; and one first metal block 301 may be disposed between two adjacent second metal blocks 302. In one column, one second metal block 302 may be disposed between two adjacent first metal blocks 301; and one first metal block 301 may be disposed between two adjacent second metal blocks 302. Such a uniform row and column distribution may facilitate the subsequent bonding of the bonding pad structure 30. The number of the first metal blocks 301 and the number of the second metal block 302 may be any appropriate value.

Further, as shown in FIG. 8, the bonding pad structure 30 may also include a metal ring 303; and the first metal ring 303 may enclose the first metal blocks 301 and the second metal blocks 302. In one embodiment, the plurality of first metal blocks 301 and the plurality of second metal blocks 302 as a whole may be a rectangle. Thus, the first metal ring 303 may be rectangular. In certain other embodiments, according to the different shapes of the plurality of first metal blocks 301 and second metal blocks 302 as a whole, the first metal ring 303 may have different shapes, such as a circle, an oval, a triangle, a square, or other polygons.

In one embodiment, in the cross-sectional plane shown in FIG. 9, two first metal blocks 301 and two second blocks 302 may be shown. That is, the first metal material and the second metal material may be shown twice, respectively; and the first metal material and the second metal material may be alternatively shown. Further, two sides (metal stripes) of the rectangular first metal ring 303 may also be shown at two sides of the complete structure formed by the first metal blocks 301 and the second metal blocks 302.

In one embodiment, the first metal ring 303 may be made of the first metal material. Thus, in the cross-sectional plane shown in FIG. 9, the first metal material may be shown four times and the second metal material may be shown two times.

The cross-sectional plane may be obtained by crossing the bonding pad structure 30 along a perpendicular equal dividing plane. The perpendicular equal dividing plane may be perpendicular to the top viewing plane of the bonding pad structure 30. Further, the perpendicular equal dividing plane may be able to divide the bonding pad structure 30 into two equal parts. In one embodiment, the cross-sectional plane along the CC' is perpendicular to the top viewing plane of the bonding pad structure 30; and the cross-sectional plane may divide the bonding pad structure 30 into two equal parts. Thus, the cross-sectional plane may belong to the perpendicular equal dividing plane. That is, the cross-sectional plane illustrated in FIG. 9 may be an equal dividing plane.

The first metal material and the second metal material may be any appropriate material. In one embodiment, the first metal material is Ge; and the second metal material is Al.

Besides the advantages of the bonding pad structure 10 illustrated in FIG. 4, the bonding pad structure 30 may provide extra benefits. Because the bonding pad structure 30 may have the first metal ring 303; and the first metal ring 303 encloses the parallel first metal blocks 301 and the second metal blocks 302, during the subsequent bonding process, the second metal blocks 302 may not only be able to form metal alloy with first metal blocks 301, but also form metal alloy with the first metal ring 303. Therefore, all the second metal blocks 202 may not be squeezed out to the surrounding area of the bonding pad structure 30. Thus, the squeezing out and extending issue may be further prevented. Accordingly, the short-circuit issue between the bonding pad structure 30 and the surrounding conductive structures may be further prevented; and the reliability of the packaging structure formed by using the bonding pad structure 30 may be further improved.

Figure 10:
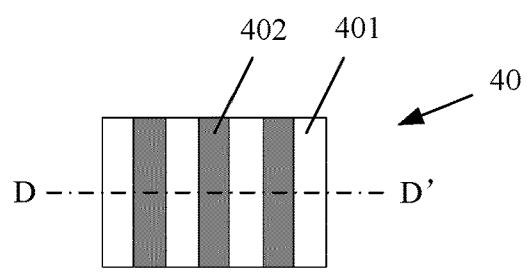
FIG. 10 illustrates a top view of another exemplary bonding pad structure consistent with the disclosed embodiments.
Figure 11:
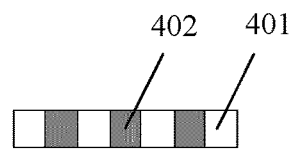
FIG. 11 illustrates a cross-sectional view of the structure illustrated in FIG. 10 along the DD' direction.

FIGS. 10-11 illustrate another exemplary bonding pad structure consistent with the disclosed embodiments. FIG. 11 is a cross-sectional view of the structure illustrated in FIG. 11 along the DD' direction.

The bonding pad structure may be made of a first metal material and a second metal material. Specifically, as shown in FIG. 10, the bonding pad structure 40 may include a first part. In one embodiment, the first part is the bonding pad structure 40 itself. The first part may include a plurality of first metal stripes 401 and a plurality of second metal stripes 402. The first metal stripes 401 and the second metal stripes 402 may be elongated first metal blocks and elongated second metal blocks. On a top viewing plane, the plurality of first metal stripes 401 and the plurality of second metal stripes 402 may be alternatively distributed. The plurality of first metal stripes 401 may be made of the first metal material; and the plurality of second metal stripes 402 may be made of the second metal material.

In one embodiment, in a cross-sectional plane illustrated in FIG. 11, the first metal stripes 401 may be shown four times; and the second metal stripes 402 may be shown three times. That is, the first metal material may be shown four times and the second metal material may be shown three times. In certain other embodiments, the first metal material and the second metal material may be shown with any appropriate number of times.

In one embodiment, the cross-sectional plane along the DD' direction may be perpendicular to the top viewing plane of the bonding pad 40. Further, the cross-sectional plane may divide the bonding pad structure 40 into to two equal parts. Thus, the cross-sectional plane may be a perpendicular and equal dividing plane. That is, the cross-sectional plane illustrated in FIG. 11 may be an equal dividing plane. The equal dividing plane may be obtained by crossing the bonding pad structure 40 along the perpendicular equal dividing plane. The perpendicular equal dividing plane may be perpendicular to the top viewing plane of the bonding pad structure 40. Further, the perpendicular equal dividing plane may be able to divide the bonding pad structure 40 into two equal parts.

The first metal material and the second metal material may be any appropriate material. In one embodiment, the first metal material is Ge; and the second metal material is Al.

Thus, the bonding pad structure 40 may have a plurality of alternatively distributed first metal stripes 401 and second metal stripes 402, during the subsequent process for bonding the bonding pad structure 40 with other bonding pad structures, the plurality of the first meal stripes 401 and the plurality of second metal stripes 402 may form metal alloy with each other. Thus, it may be able to prevent the second metal stripes 402 from excessively overflowing around the bonding pad structure 40. Accordingly, the squeezing out and extending issue may be prevented; and the short-circuit between the bonding pad structure 40 and the surrounding conductive structures may be prevented; and the reliability of the packaging structure formed by using the disclosed bonding pad structure 40 may be improved.

Figure 12:
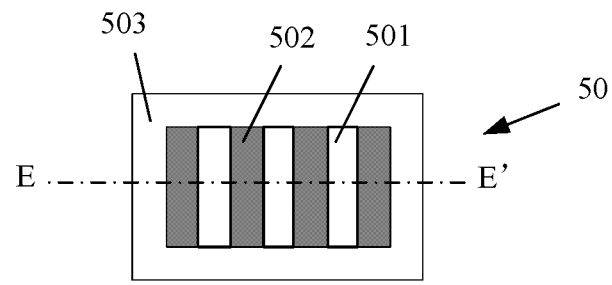
FIG. 12 illustrates a top view of another exemplary bonding pad structure consistent with the disclosed embodiments.
Figure 13:
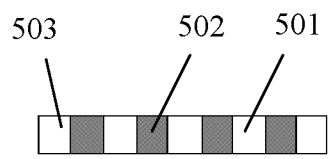
FIG. 13 illustrates a cross-sectional view of the structure illustrated in FIG. 12 along the EE' direction.

FIGS. 12-13 illustrate another exemplary bonding pad structure consistent with the disclosed embodiments. FIG. 13 is a cross-sectional view of the structure illustrated in FIG. 12 along the EE' direction.

The bonding pad structure may be made of a first metal material and a second metal material. Specifically, as shown in FIG. 12, the bonding pad structure 50 may include a first part. In one embodiment, the first part is a portion of the bonding pad structure 50. The first part may include a plurality of first metal stripes 501 and a plurality of second metal stripes 502. On a top viewing plane, the plurality of first metal stripes 501 and the plurality of second metal stripes 502 may be alternatively distributed. The plurality of first metal stripes 501 may be made of the first metal material; and the plurality of second metal stripes 502 may be made of the second metal material.

Further, the bonding pad structure 50 may also include a first metal ring 503. On a top viewing plane, the first metal ring 503 may enclose the first part. In one embodiment, the first meal stripes 501 and the second metal stripes 502 as a whole may be a rectangle. The first metal ring 503 may have a rectangular shape surrounding the first part. In certain other embodiments, when the first part has other shapes, the shape of the first metal ring 503 may change accordingly.

In one embodiment, in a cross-sectional plane illustrated in FIG. 13, the first metal stripes 501 may be shown three times; and the second metal stripes 502 may be shown four times. In one embodiment, the first metal ring may be made of the first metal material. Thus, the first metal material may be shown five times and the second metal material may be shown four times. In certain other embodiments, the first metal material and the second metal material may be shown with any appropriate number of times.

In one embodiment, the cross-sectional plane along the EE' direction may be perpendicular to the top viewing plane of the bonding pad 50. Further, the cross-sectional plane may divide the bonding pad 50 into to equal parts. Thus, the cross-sectional plane may be a perpendicular and equal dividing plane. That is, the cross-sectional plane illustrated in FIG. 13 may be an equal dividing cross-sectional plane. The equal dividing plane may be obtained by crossing the bonding pad 50 along the perpendicular equal dividing plane. The perpendicular equal dividing plane may be perpendicular to the top viewing plane of the bonding pad structure 50. Further, the perpendicular equal dividing plane may be able to divide the bonding pad structure 50 into two equal parts.

The first metal material and the second metal material may be any appropriate material. In one embodiment, the first metal material is Ge; and the second metal material is Al.

Thus, the bonding pad structure 50 may have a plurality of alternatively distributed first metal stripes 501 and second metal stripes 502, and the first metal ring 503, during the subsequent process for bonding the bonding pad structure 50 with other structures, the plurality of the first meal stripes 501 and the plurality of second metal stripes 502 and the first metal ring 503 may form metal alloy with each other. Thus, it may be able to prevent the first metal stripes 501 and the second metal stripes 502 from excessively overflowing around the bonding pad structure 50. Accordingly, the squeezing out and extending issue may be prevented; and the short-circuit between the bonding pad structure 50 and the surrounding conductive structures may be prevented; and the reliability of the packaging structure formed by using the disclosed bonding pad structure 50 may be improved.

Figure 14:
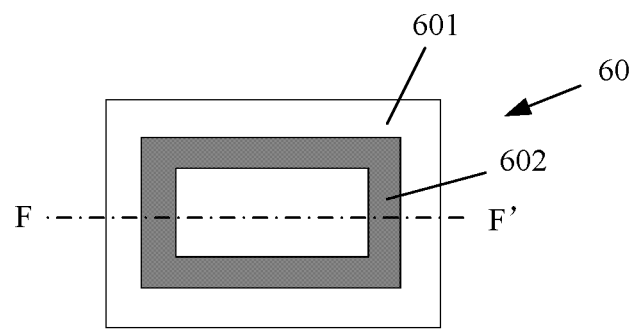
FIG. 14 illustrates a top view of another exemplary bonding pad structure consistent with the disclosed embodiments.
Figure 15:
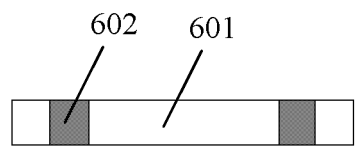
FIG. 15 illustrates a cross-sectional view of the structure illustrated in FIG. 14 along the FF' direction.

FIGS. 14-15 illustrate another exemplary bonding pad structure consistent with the disclosed embodiments. FIG. 15 is a cross-sectional view of the structure illustrated in FIG. 14 along the FF' direction.

The bonding pad structure may be made of a first metal material and a second metal material. Specifically, as shown in FIG. 14, the bonding pad structure 60 may include a metal plate 601 and a metal ring 602. On a top viewing plane of the bonding pad structure 60, the metal ring 602 may be embedded into the metal plate 601. The metal plate 601 may be made of the first metal material; and the metal ring 602 may be made of the second metal material.

In one embodiment, in a cross-sectional plane illustrated in FIG. 15, the metal plate 601 may be shown three times; and the metal ring 602 may be shown two times That is, the first metal material may be shown three times; and the second metal material may be shown two times. In certain other embodiments, the first metal material and the second metal material may be shown with any appropriate number of times.

In one embodiment, the cross-sectional plane along the FF' direction may be perpendicular to the top viewing plane of the bonding pad 60. Further, the cross-sectional plane may divide the bonding pad 60 into to equal parts. Thus, the cross-sectional plane may be a perpendicular and equal dividing plane. That is, the cross-sectional plane illustrated in FIG. 15 may be an equal dividing plane. The equal dividing plane may be obtained by crossing the bonding pad structure 60 along the perpendicular equal dividing plane. The perpendicular equal dividing plane may be perpendicular to the top viewing plane of the bonding pad structure 60. Further, the perpendicular equal dividing plane may be able to divide the bonding pad structure 60 into two equal parts.

The first metal material and the second metal material may be made of any appropriate material. In one embodiment, the first metal material is Ge; and the second metal material is Al.

Thus, the bonding pad structure 60 may have a metal plate 601 and a metal ring 602. Further, on the top viewing plane of the bonding pad structure 60, the metal ring 602 may be embedded in the metal plate 601. Therefore, during the subsequent process for bonding the bonding pad structure 60 with other structures, the metal ring 602 with a better ductility may directly form metal alloy with the metal plate

601. Thus, the metal ring 602 may not overflow around the bonding pad structure 60. Accordingly, the squeezing out and extending issue may be prevented; the short-circuit between the bonding pad structure 60 and the surrounding conductive structures may be prevented; and the reliability of the packaging structure formed by using the disclosed bonding pad structure 60 may be improved.

Figure 16:
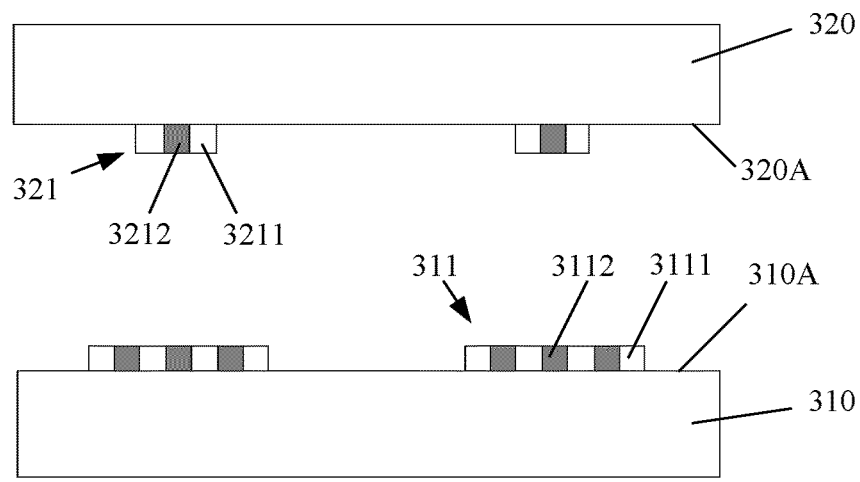
FIG. 16 illustrates a structure corresponding to certain stages of an exemplary MEMS packaging method consistent with the disclosed embodiments.
Figure 24:
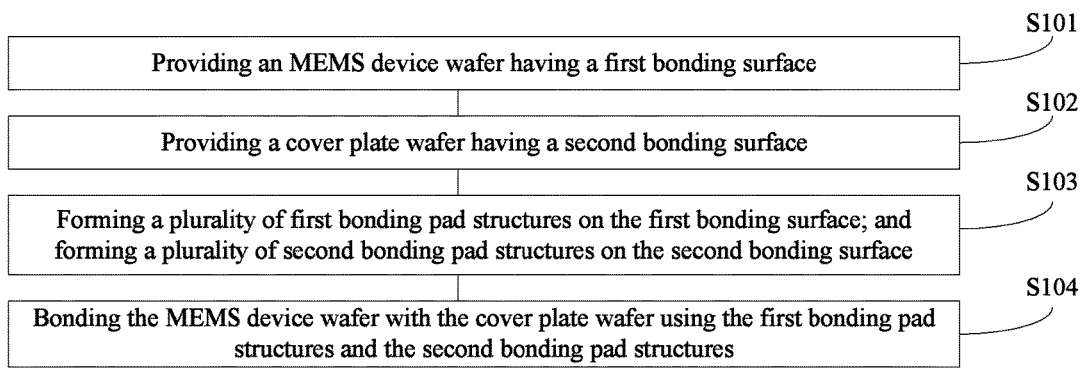
FIG. 24 illustrates an exemplary MEMS device packaging process consistent with the disclosed embodiments.

FIG. 24 illustrates an exemplary MEMS device packaging process consistent with the disclosed embodiments. FIG. 16 illustrates a structure corresponding to certain stages of the exemplary MEMS packaging process.

As shown in FIG. 24, at the beginning of the packaging process, a MEMS device wafer is provided (S101). FIG. 16 illustrates a corresponding structure.

As shown in FIG. 16, an MEMS device wafer 310 is provided. The MEMS device wafer 310 may have a first bonding surface 310A.

After providing the MEMS device wafer 310, a cover plate wafer 320 may be provided (S102). The cover plate wafer 320 may have a second bonding surface 320A.

In one embodiment, a plurality of MEMS device units may be formed on the MEMS device wafer 310. For illustrative purposes, one MEMS device unit is shown in FIG. 16. Further, a plurality of sealing units may be formed on the cover plate wafer 320. The sealing units may be corresponding to the MEMS device units one-on-one. Still for illustrative purposes, one sealing unit is shown in FIG. 16.

In one embodiment, there is no control circuit on the cover plate wafer 320. That is, no control circuit is formed on the cover plate wafer 320. In certain other embodiments, appropriate control circuits may be formed on the cover plate wafer 320.

Further, after providing the cover plate wafer 320, a plurality of first bonding pad structures 311 may be formed on the first bonding surface 310A; and a plurality of second bonding pad structures 321 may be formed on the second bonding surface 320A (S103).

In one embodiment, the cross-sectional plane of first the bonding pad structures 311 may be an equal dividing plane. The definition of the equal dividing plane may be similar to the previously described ones.

As shown in FIG. 16, in one embodiment, on the cross-sectional plane, one first bonding pad structure 311 may have four first metal blocks 3111 and three second metal blocks 3112. The first bonding pad structures 311 may be one or more of the disclosed bonding pad structures described previously.

Further, as shown in FIG. 16, in one embodiment, on the cross-sectional plane, one second bonding pad structure 321 may have two third metal blocks 3211 and one fourth metal block 3212. The second bonding pad structures 321 may be one or more of the disclosed bonding pad structures described previously.

Further, after forming the plurality of first bonding pad structures 320 and the plurality of second bonding pad structures 321, the MEMS device wafer 310 and the cover plate wafer 320 may be bonded together using the first bonding structures 311 and the second bonding pad structures 321 (S104).

In one embodiment, during the bonding process, the alloy formed between the first metal blocks 3111 and the fourth metal blocks 3212 and the alloy formed between the third metal blocks 3211 and the second metal blocks 3112 may provide the major bonding functions. Further, the alloy process between the first metal blocks 3111 and the second metal blocks 3112 and the alloy process between the third metal blocks 3211 and the fourth metal blocks 3212 may also facilitate the bonding process between the MEMS device wafer 310 and the cover plate wafer 320.

Further, the alloy formed between the first metal blocks 3111 and the second metal blocks 3112 and the alloy formed between the third metal blocks 3211 and the fourth the metal blocks 3212 may prevent the overflow of the metal having the better ductility. Thus, the squeezing out and extending issue may be prevented. Accordingly, the short-circuit issue among adjacent bonding pad structures; and between the bonding pad structures and adjacent conductive structures may be avoided; and the reliability of the packaging structure may be improved.

In one embodiment, during the bonding process, it may only need to cause the first bonding pad structures 311 that has a relatively small area to entirely contact with the second bonding pad structures 321 that has a relatively large area, the alignment between the first metal blocks 3111 and the fourth metal blocks 3212 may not be considered. Similarly, the alignment between the third metal blocks 3211 and the second metal blocks 3112 may not be considered. That is, the alignments between the first bonding pad structures 311 and the second bonding pad structures 321 may not affect the bonding between the MEMS device wafer 310 and the cover plate wafer 320.

In certain other embodiments, the disclosed bonding pad structures may only be formed on the first bonding surface 310A; and the existing bonding pad structures may be formed on the second bonding surface 320A. Similarly, the disclosed bonding pad structures may only be formed on the second bonding face 320A and the existing bonding pad structures may be formed on the first bonding surface 310A. Under such configurations, the existing bonding pad structures may be made of a material having a moderate ductility, such as Ge. Accordingly, the disclosed bonding pad structures may not only form an alloy with the metal of the existing bonding pad structures, but also form an alloy inside between the first metal material and the second metal material. Thus, using the disclosed bonding pad structures may prevent the second metal material from overflowing. That is, the squeezing out and extending issue may be prevented.

In one embodiment, the first metal material is Ge; and the second metal material is Al. Based on the phase diagram of Ge and Al, when the temperature of the bonding process is approximately 424° C., Ge and Al may be able to form GeAl alloy with an atomic ratio of 1:1. Under such a condition, the mass ratio between Ge and Al is:

$t_1/t_2 = (At\%_1 \times \rho_1 \times A_1)/(At\%_2 \times \rho_2 \times A_2)$. $t_1/t_2$ is the mass ratio between the Ge and Al. At $\%_1$/At $\%_2$ is the atomic ratio between the concentration of Ge and the concentration of Al, it may be 1 when the bonding temperature is approximately 424° C. That is At $\%_1$/At $\%_2 = 1$. $\rho_1/\rho_2$ is the ratio between the density of Ge and the density of Al; and $A_1/A_2$ is the ratio between the atomic mass of Ge and the atomic mass of Al. When all the values are input in the equation, $t_1/t_2 = 0.59$.

Based on such an analysis, when the first bonding pad structures 311 is not electrically connected with circuit structures on the MEMS device wafer 310, the conductivity of the first bonding pad structures 311 may not be considered. Thus, the ratio of Al may be decreased; and the ratio of Ge may be increased. Accordingly, during the bonding process, Al may entirely consumed; and the overflowing of Al may be further prevented. Therefore, when the first bonding pad structures 311 is not electrically connected with the circuit structures on the MEMS device wafer 310, the mass ratio between the first metal material and the second metal material in the first bonding pad structures 311 may be in a range of approximately 0.59-0.71.

When the first bonding pad structures 311 is electrically connected with the circuit structures on the MEMS device wafer 310, the conductivity of the first bonding pad structures 311 may be appropriately increased. That is, the ratio of Ge may be decreased; and the ratio of Al may be increased. However, the ratio of Al may be controlled within an appropriate range to prevent the overflowing of Al. Thus, when the first bonding pad structures 311 is electrically connected with the circuit structures on the MEMS device wafer 310, the mass ratio between the first metal material and the second metal material in the first bonding pad structures 311 may be in a range of approximately 0.47-0.59.

In certain other embodiments, circuit structures may be formed on the cover plate wafer 320. When the second bonding pad structures 321 is not electrically connected with the circuit structures on the cover plate wafer 320, the mass ratio between the first metal material and the second metal material in the second bonding pad structures 321 may be in a range of approximately 0.59-0.71. When the second bonding pad structures 321 is electrically connected with the circuit structures on the cover plate wafer 320, the mass ratio between the first metal material and the second metal material in the second bonding pad structures 321 may be in a range of approximately 0.47-0.59.

After bonding the MEMS device wafer 310 and the cover plate wafer 320, the method may also include thinning the MEMS device wafer 310 and the cover plate wafer 320; and dicing the individual MEMS device units in the MEMS device wafer 310. Correspondingly, the sealing units in the cover plate unit 320 may also be diced. Thus, packaged MEMS devices may be formed.

In such an MEMS device packaging method, by using the first bonding pad structures 311 and the second bonding pad structures 321, during the bonding process, the second metal material that has a relatively good ductility may not easily overflow. Thus, the squeezing out and extending issue during the bonding process of the bonding pad structures may be prevented. Accordingly, the short-circuit issue among adjacent bonding pad structures may be avoided; and the reliability of the packaging structures may be improved.

Further, the first bonding pad structures 311 and the second bonding pad structures 321 may be formed on the corresponding bonding surfaces directly; and it may not require to form protruding structures or trenches, etc. Thus, the process steps of the packaging structure may be simplified. Accordingly, the process time of the packaging method may be shortened; and the cost of the packaging process may be reduced.

Figure 17:
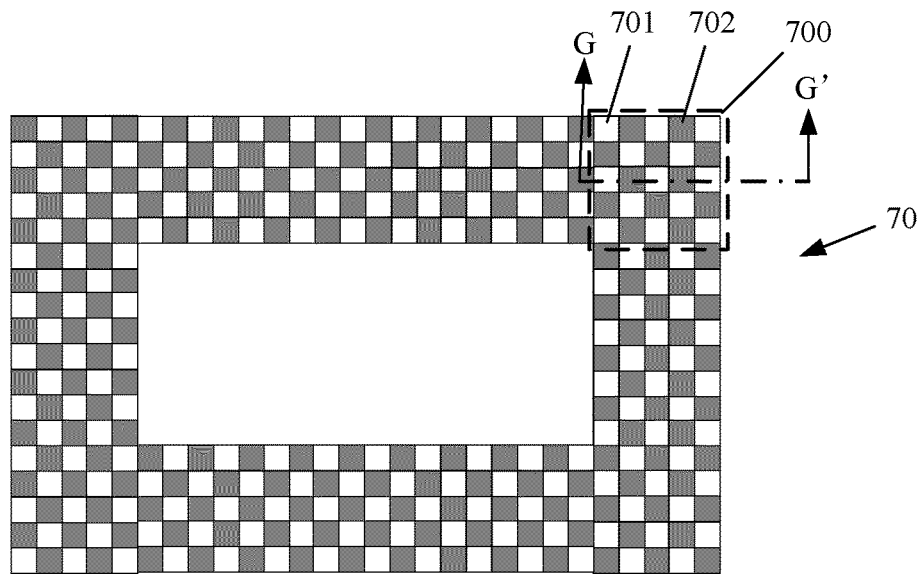
FIG. 17 illustrates an exemplary bonding ring structure consistent with the disclosed embodiments.
Figure 18:
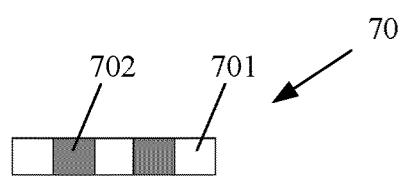
FIG. 18 illustrates a cross-sectional view of a bonding ring unit of the structure illustrated in FIG. 17 along GG' direction.

FIGS. 17-18 illustrate an exemplary bonding ring structure consistent with the disclosed embodiments. FIG. 17 is the top view of the bonding ring structure; and FIG. 18 is a cross-sectional view of the bonding ring structure illustrated in FIG. 17 along the GG' direction.

As shown in FIG. 17, the bonding ring structure 70 may include a plurality of bonding pad units 700. The structure enclosed by the dotted line may refer to one bonding pad unit 700.

The bonding pad unit 700 may be made of a first metal material and a second metal material. Specifically, each of the bonding pad units 700 may include a plurality of first metal blocks 701 and a plurality of second metal blocks 702. On a top viewing plane, the plurality of first metal blocks 701 and the plurality of second metal blocks 702 may be distributed into rows and columns. The plurality of first metal blocks 701 may be made of the first metal material; and the plurality of second metal blocks 702 may be made of the second metal material.

Further, in the top viewing plane illustrated in FIG. 17, in one row of each bonding pad unit 700, one second metal block 702 may be disposed between two adjacent first metal blocks 701; and one first metal block 701 may be disposed between two adjacent second metal blocks 702. In one column of each bonding pad unit 700, one second metal block 702 may be disposed between two adjacent first metal blocks 701; and one first metal block 701 may be disposed between two adjacent second metal blocks 702.

In one embodiment, the bonding pad unit 700 at the cross-sectional plane illustrated in FIG. 18 may show three first metal blocks 701 and two second metal blocks 702. That is, three portions of first metal material and two portions of the second metal material may be shown in the cross-sectional view illustrated in FIG. 18.

The bonding pad units 700 may also include one or more of the disclosed bonding pad structures illustrated in FIGS. 6-15. The bonding ring structure 70 may include a plurality of disclosed bonding pad structures illustrated in FIGS. 6-15, and may be distributed with any appropriate patterns and sequences, etc.

Thus, in the bonding ring structure 70, the bonding pad units 700 may include a plurality of first metal blocks 701 and a plurality of second metal blocks 702, during the subsequent process for bonding the bonding ring structure 70 with other structures, the plurality of first meal blocks 701 and the plurality of second metal blocks 702 may directly form metal alloy. That is, the first metal material and the second metal material may directly form metal alloy. Further, the first metal blocks 701 and the second metal blocks 702 may be alternatively distributed. Thus, it may be able to prevent the first metal blocks 701 and the second metal blocks 701 from excessively overflowing around the bonding ring structure 70. Even there is an overflow of metals, it may be a small portion of overflow from individual second metal blocks 702, the overflow amount may be acceptable. Therefore, when the bonding ring structure 70 is used for a bonding process, the squeezing out and extending process may be prevented; and the short-circuit issue between the bonding ring structure 70 and the surrounding conductive structures may be prevented; and the reliability of the packaging structure using the bonding ring structure 70 may be improved.

Figure 25:
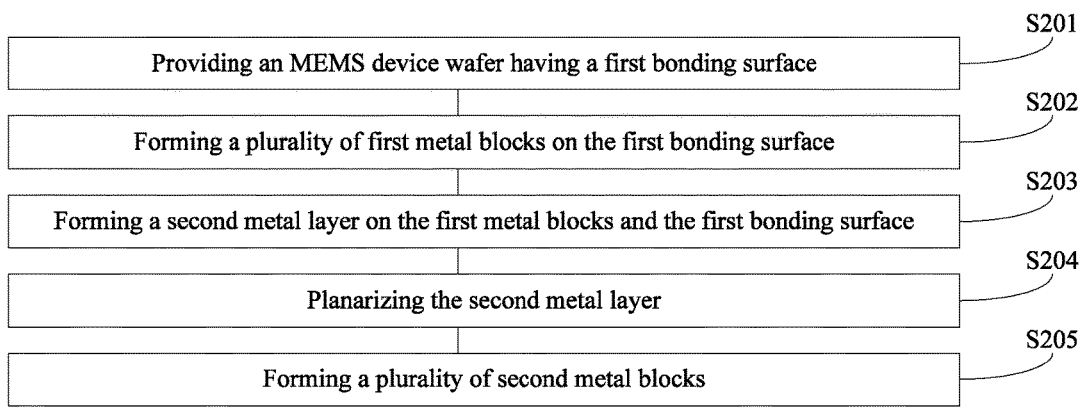
FIG. 25 illustrates another exemplary MEMS device packaging process consistent with the disclosed embodiments.

FIG. 25 illustrates another exemplary packaging method of MEMS structures. FIGS. 19-23 illustrate structures corresponding certain stages of the exemplary packaging method.

Figure 19:
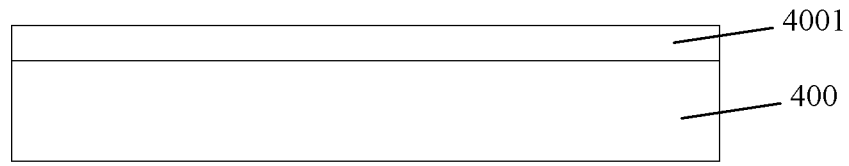
FIGS. 19-23 illustrate structures corresponding to certain stages of another exemplary MEMS device packaging process consistent with the disclosed embodiments.

As shown in FIG. 25, at the beginning of the packaging process, an MEMS device wafer is provided (S201). FIG. 19 illustrates a corresponding structure.

As shown in FIG. 19, an MEMS device wafer 400 is provided. The MEMS device wafer 400 may have a first bonding surface (not labeled). Further, a first metal material layer 4001 may be formed on the first bonding surface.

The first metal material layer 4001 may be made of any appropriate material, such as Ge, etc. Various processes may be used to form the first metal material layer 4001, such as a physical vapor deposition (PVD) process, a sputtering process, or an electroplating process, etc.

Figure 20:
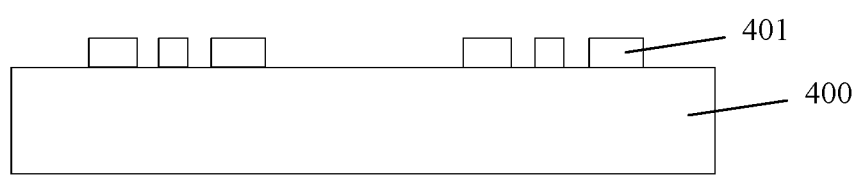

Returning to FIG. 25, after forming the first metal material layer 4001, a plurality of first metal blocks may be formed (S202). FIG. 20 illustrates a corresponding structure.

As shown in FIG. 20, a plurality of first metal blocks 401 are formed on the surface of the MEMS device wafer 400.

The plurality of first metal blocks 401 may be formed by etching the first metal material layer 4001. Thus, a plurality of trenches (not labeled) may be also be formed among the plurality of first metal blocks 401. The plurality of trenches may be used to subsequently form second metal blocks.

The first metal material layer 4001 may be etched by any appropriate process, such as a dry etching process, a wet etching process, or an ion beam etching process, etc. Before the etching process, a patterned mask layer may be formed on the first metal layer 4001. The patterned mask layer may be used as an etching mask.

Figure 21:
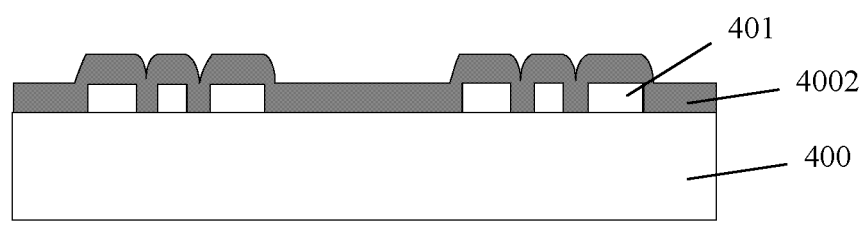

Returning to FIG. 25, after forming the plurality of first metal blocks 401, a second metal layer may be formed (S203). FIG. 21 illustrates a corresponding semiconductor structure.

As shown in FIG. 21, a second metal material layer 4002 is formed on the first bonding surface of the MEMS device wafer 400. The second metal material layer 4002 may cover the first metal blocks 401, and fill the plurality of the trenches.

The second metal material layer 4002 may be made of any appropriate material, such as Al, etc. Various processes may be used to form the second metal material layer, such as a PVD process, a sputtering process, or a chemical plating process, etc.

Figure 22:
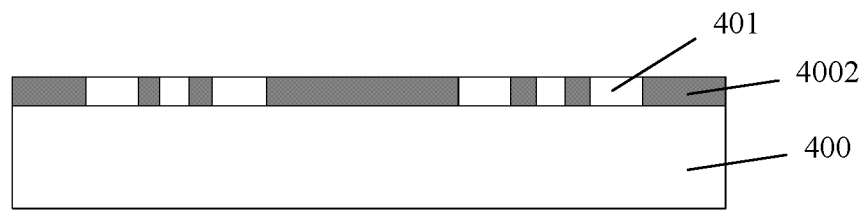

Returning to FIG. 25, after forming the second metal material layer 4002, a planarization process may be performing (S204). FIG. 22 illustrates a corresponding structure.

As shown in FIG. 22, a planarization process may be performed to remove portions of the second metal material layer 4002 higher than the first metal blocks 401. That is, the planarization process may be performed until the top surfaces of the first metal blocks 401 are exposed. The planarization process may be any appropriate process, such as a chemical mechanical polishing process, or a physical mechanical polishing process, etc.

Figure 23:
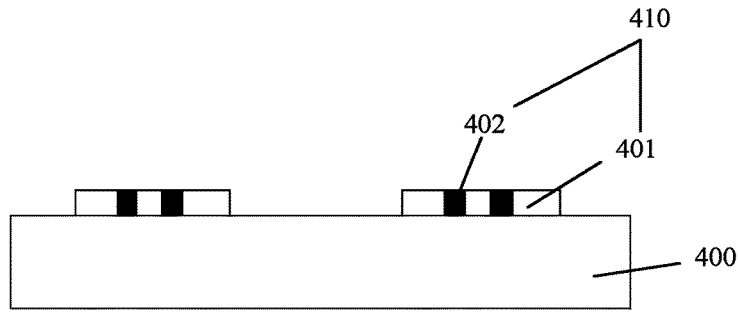

Returning to FIG. 25, after the planarization process, a plurality of second metal blocks may be formed (S205). FIG. 23 illustrates a corresponding structure.

As shown in FIG. 23, portions of the planarized second metal material layer 4002 may be removed; and a plurality of second metal blocks 402 may be formed. A plurality of second metal blocks 402 and a plurality of first metal blocks 401 may form one bonding ring structure 410. Thus, one or more bonding ring structures 410 may be formed on the MEMS device wafer 400. The portions of the planarized second metal material layer 4002 may be removed by any appropriate process, such as a dry etching process, or a wet etching process, etc.

Further, after forming the bond ring structures 410, a cover plate wafer (not shown) may be provided. The cover plate wafer may have second bonding surface. One or more bonding ring structures may be formed on the second bonding surface. The bonding ring structures may be the bonding ring structures 410 illustrated in FIG. 23, or other appropriate disclosed bonding ring structures.

After providing the cover plate wafer having the bonding ring structure, the MEMS device wafer 400 and the cover plate wafer may be bonded together by appropriate pressure and temperature, etc. Thus, an MEMS packaging structure may be formed.

In certain other embodiments, a plurality of disclosed bonding ring structures may be formed on the MEMS device wafer 400; and appropriate existing bonding ring structures may be formed on the cover plate wafer. In still certain other embodiments, a plurality of disclosed bonding ring structures may be formed on the cover plate wafer; and appropriate of existing bonding ring structures may be formed on the MEMS device wafer 410. Then, the MEMS device wafer 400 and the cover plate wafer may be bonded together.

In one embodiment, when the bonding ring structures are not electrically connected with circuit structures on the MEMS device wafer 400 and the cover plate wafer, the mass ratio between the first metal material and the second metal material may be in a range of approximately 0.59-0.71. When the bonding ring structures are electrically connected with circuit structures on the MEMS device wafer 400 and/or the cover plate wafer, the mass ratio between the first metal material and the second metal material may be in a range of approximately 0.47-0.59.

Thus, in the disclosed MEMS device packaging method, the disclosed bonding ring structures 410 may be used to bond the MEMS device wafer 400 and the cover plate wafer. The bonding ring structures 410 may include a plurality of disclosed bonding pad units. When the disclosed bonding ring structures 410 are used to bond the MEMS device wafer 400 and the cover plate wafer, the steps of the bonding process may be simplified. Thus, the process cost may be relatively low; and the reliability of the MEMS packaging structure may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A bonding structure, comprising:
 a plurality of first bonding pad structures formed on a first bonding surface, each of the plurality of first bonding pad structures comprising:
  a plurality of first metal blocks made of a first metal material; and
  a plurality of second metal blocks made of a second metal material, wherein
  the plurality of first metal blocks and the plurality of second metal blocks are arranged alternately in a two dimensional matrix form, and
  the plurality of first metal blocks are configured to confine squeezing out and extending of the plurality of the second metal blocks;
 a plurality of second bonding pad structures formed on a second bonding surface, each of the plurality of second bonding pad structures comprising:
  a plurality of third metal blocks made of the first metal material; and
  a plurality of fourth metal blocks made of the second metal material, wherein
  the plurality of first bonding pad structures and the plurality of second bonding pad structure are bonded together by forming an alloy between the plurality of first metal blocks on the first bonding surface and the plurality of fourth metal blocks on the second bonding surface and by forming the alloy between the plurality of second metal blocks on the first bonding surface and the plurality of third metal blocks on the second bonding surface.

2. The bonding structure according to claim 1, on top viewing plane, wherein:

the plurality of first metal blocks and the plurality of second metal blocks are distributed into columns and rows alternately in the two dimensional matrix form;

one second metal block is disposed between two adjacent first metal blocks in each row; and one first metal block is disposed between two adjacent second metal blocks in each column.

3. The bonding structure according to claim 1, further comprising:

a first metal ring enclosing the plurality of first metal blocks and the second metal blocks on a top viewing plane of the bonding pad structure.

4. The bonding structure according to claim 1, wherein:

the plurality of first metal blocks are a plurality of first metal stripes;

the plurality of second metal blocks are a plurality of second metal stripes; and the plurality of first metal stripes and the plurality of second metal stripes are distributed alternatively on a top viewing plane of the bonding pad structure.

5. The bonding structure according to claim 4, further comprising:

a first metal ring enclosing the first metal stripes and the second metal stripes on a top viewing plane.

6. The bonding structure according to claim 1, wherein the ductility of the second metal material is better than the ductility of the first metal material, the first metal material comprising Ge and the second metal material comprising Al.

7. The bonding structure according to claim 6, on at least one equal dividing plane, wherein:

the first metal material and the second metal material are shown alternatively; and most outer sides of the equal dividing plane are the first metal material.

8. The bonding structure according to claim 6, wherein:

when circuit structures are electrically connected with the plurality of first bonding pad structures or when circuit structures are electrically connected with the plurality of second bonding pad structures:

each of the plurality of first bonding pad structures has more Ge atoms than Al atoms and each of the plurality of second bonding pad structures has more Ge atoms than Al atoms; and a mass ratio between the first metal material Ge and the second metal material Al is in a range of approximately 0.47-0.59.

9. A bonding ring structure according to claim 1, comprising:

a plurality of the bonding pad structures.

10. The bonding ring structure according to claim 9, wherein:

the plurality of bonding pad structures are distributed into a rectangular ring.

11. The bonding structure according to claim 1, wherein:

an area of each of the plurality of first bonding pad structures is smaller than an area of each of the plurality of second bonding pad structures.

* * * * *